United States Patent
Takahashi et al.

(10) Patent No.: US 8,969,157 B2
(45) Date of Patent: Mar. 3, 2015

(54) METHOD OF MANUFACTURING SEMICONDUCTOR DEVICE HAVING FIELD PLATE ELECTRODE

(71) Applicant: Kabushiki Kaisha Toshiba, Minato-ku (JP)

(72) Inventors: Nobuhiro Takahashi, Ishikawa-ken (JP); Yukie Nishikawa, Ishikawa-ken (JP); Yasuhiko Akaike, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/023,235

(22) Filed: Sep. 10, 2013

(65) Prior Publication Data

US 2014/0287574 A1 Sep. 25, 2014

(30) Foreign Application Priority Data

Mar. 22, 2013 (JP) .................. 2013-061119

(51) Int. Cl.
  *H01L 21/00* (2006.01)
  *H01L 21/28* (2006.01)
(52) U.S. Cl.
  CPC .................. *H01L 21/28008* (2013.01)
  USPC .......................................... 438/270; 438/272

(58) Field of Classification Search
  USPC .......................................... 438/268–270, 272
  See application file for complete search history.

(56) References Cited

FOREIGN PATENT DOCUMENTS

| JP | 2008-270606 A | 11/2008 |
|---|---|---|
| JP | 2011-199109 A | 10/2011 |
| WO | 2005/065385 A2 | 7/2005 |

OTHER PUBLICATIONS

Machine translation of JP 2011-199109A.*

* cited by examiner

*Primary Examiner* — Richard Booth
(74) *Attorney, Agent, or Firm* — White & Case LLP

(57) ABSTRACT

According to one embodiment, in a method of a semiconductor device, a trench is formed in the direction of a lower surface from an upper surface of a semiconductor layer. A first insulating film is formed to cover an inner surface of the trench. An electrode material is formed to fill the trench and cover the upper surface of the semiconductor layer. The electrode material is selectively removed except a portion of the electrode material to fill the trench and a portion of the electrode material to cover an opening of the trench. The first insulating film to cover an upper portion of the trench is removed. The portions of the electrode material to fill the trench and cover the opening of the trench are etched back to form a first electrode at a lower portion of the trench.

12 Claims, 11 Drawing Sheets

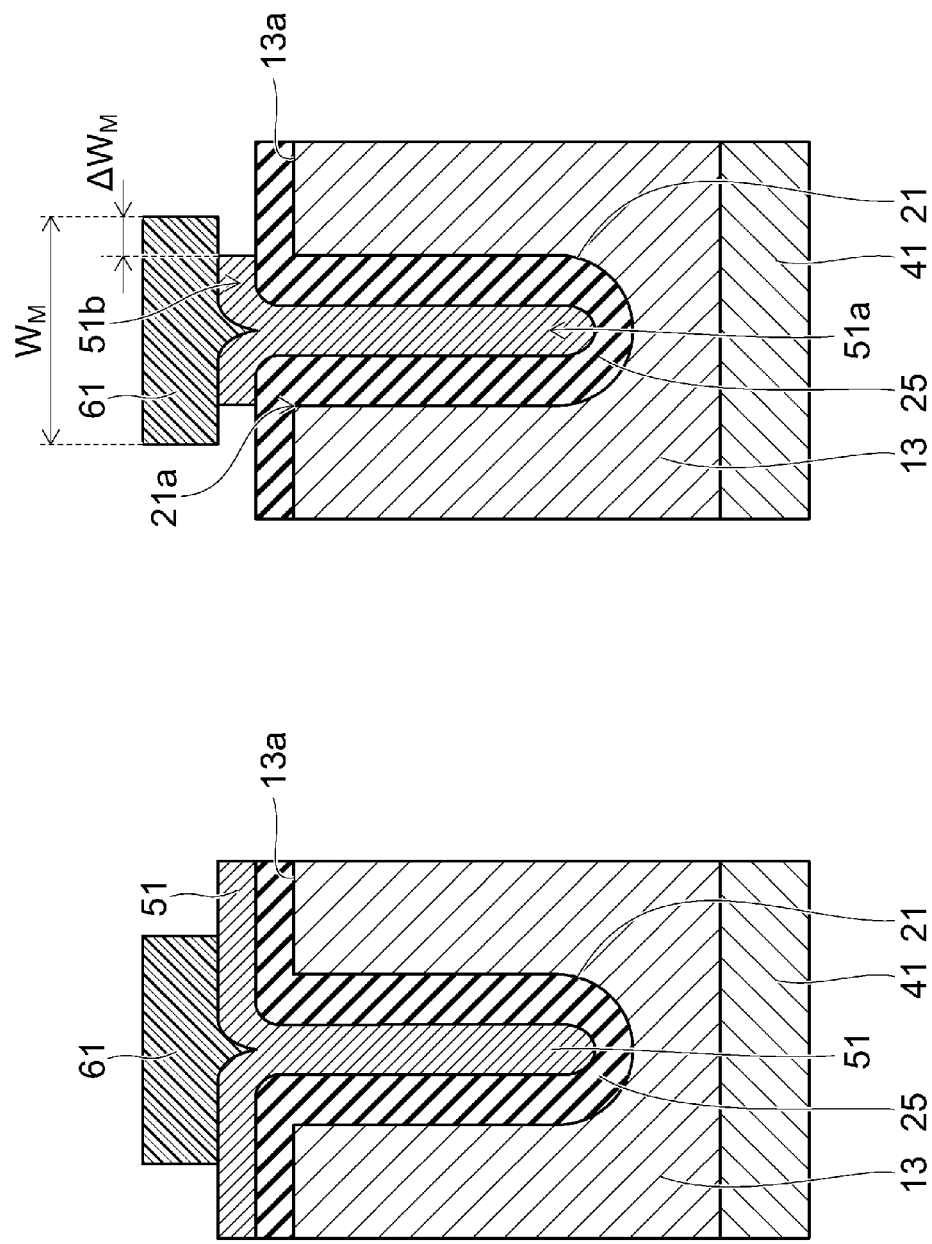

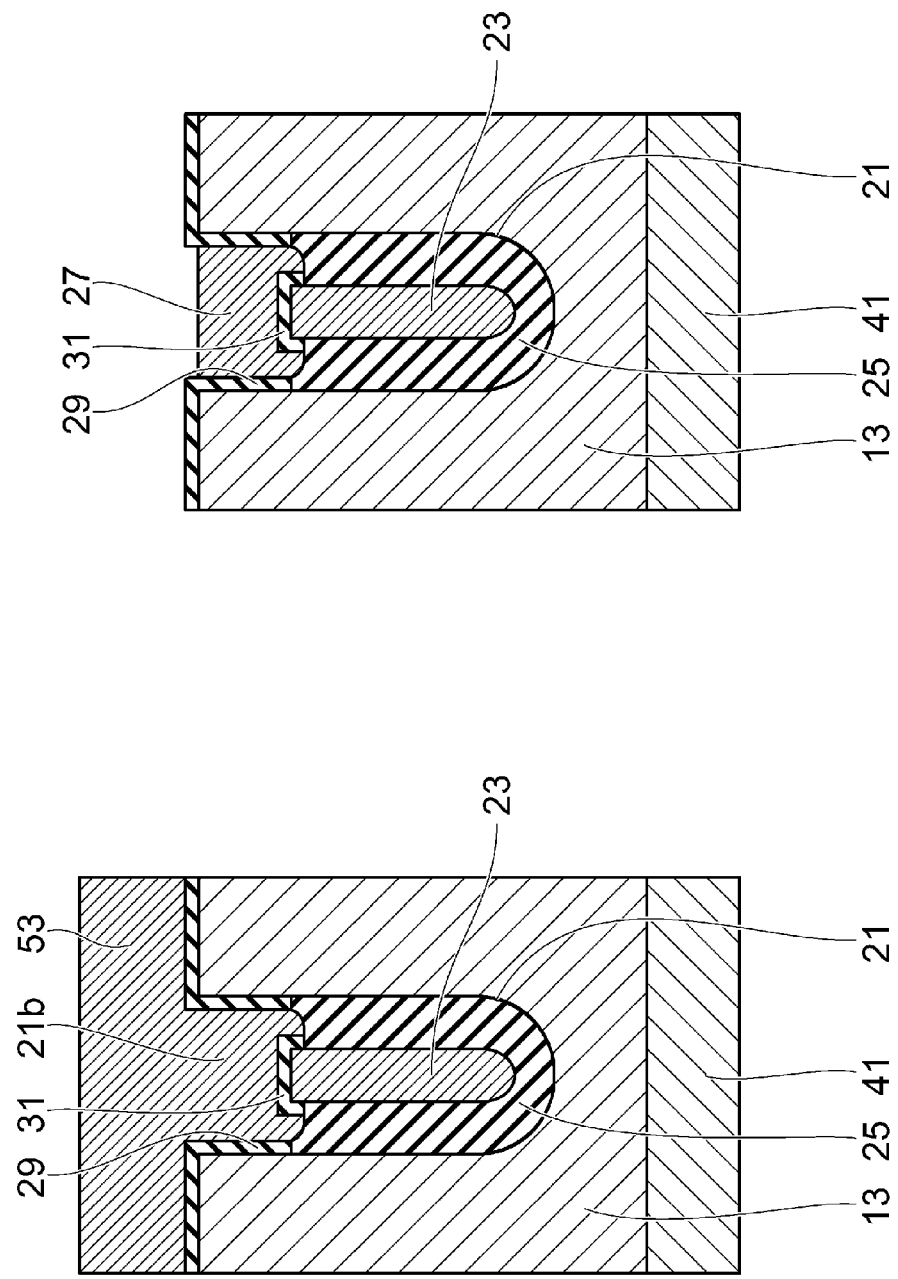

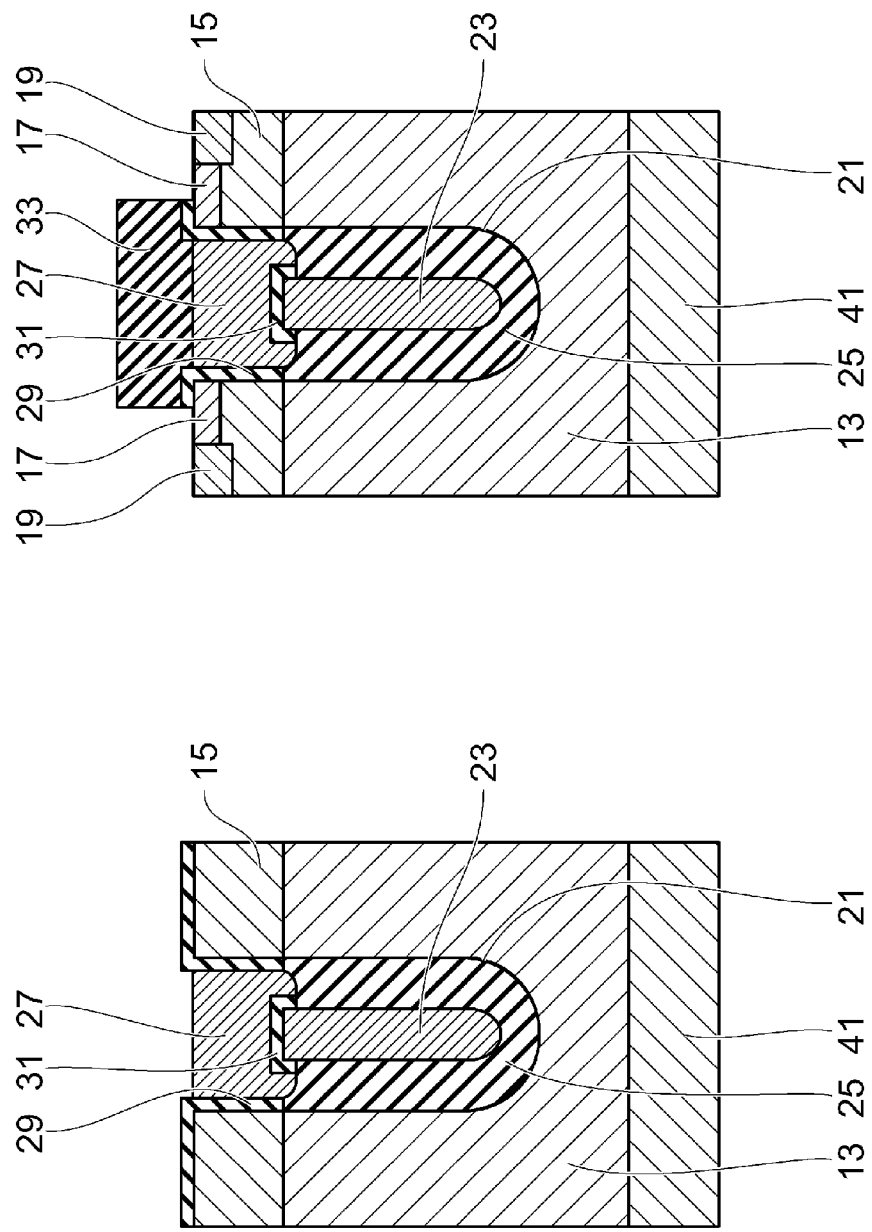

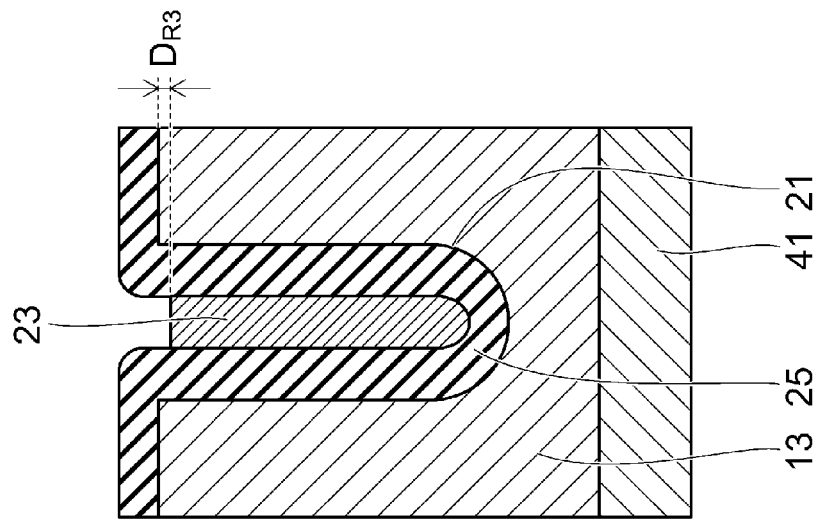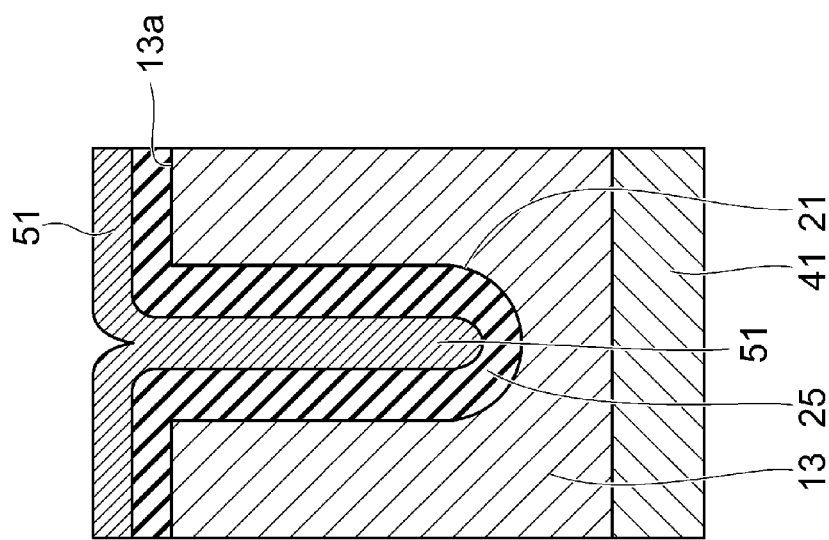
FIG. 8A
FIG. 8B

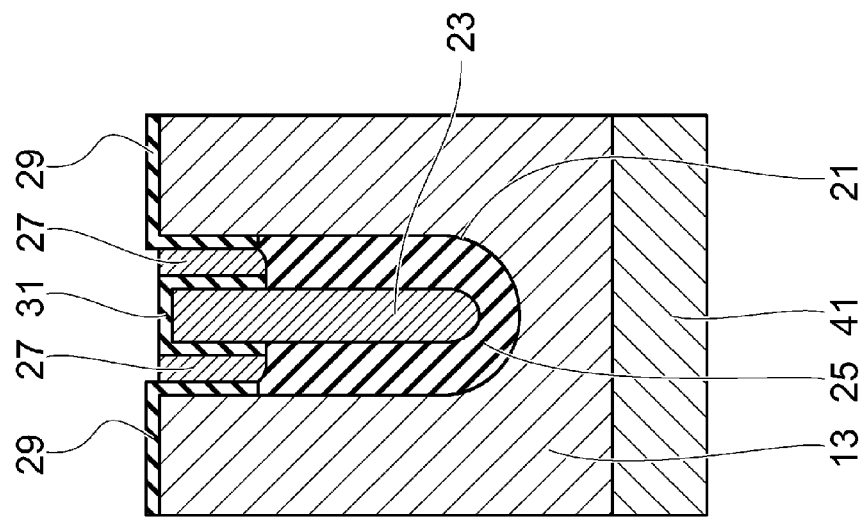
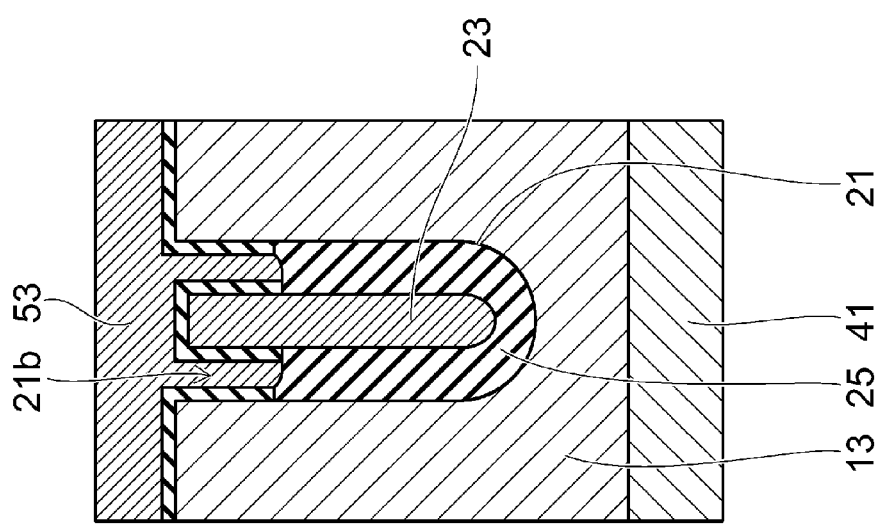

METHOD OF MANUFACTURING SEMICONDUCTOR DEVICE HAVING FIELD PLATE ELECTRODE

CROSS REFERENCE TO RELATED APPLICATION

This application is based upon and claims the benefit of priority from the prior Japanese Patent Application No. 2013-061119, filed on Mar. 22, 2013, the entire contents of which are incorporated herein by reference.

FIELD

Embodiments described herein relate generally to a method of manufacturing a semiconductor device.

BACKGROUND

Semiconductor devices which are employed for switching control of an electric power, and the like are key devices to realize low power consumption of household and industrial instruments, and high performance of the semiconductor devices is required. In order to suppress switching loss of a current flowing between a source and a drain of a MOSFET (Metal Oxide Semiconductor Field Effect Transistor), for example, reduction of parasitic capacitances between a gate and the source and between the gate and the drain is required.

BRIEF DESCRIPTION OF THE DRAWINGS

FIGS. 2A, 2B, 3A, 3B, 4A, 4B, 5A, 5B, 6A, 6B, 7A and 7B are schematic sectional views showing steps of manufacturing the semiconductor device in sequential order according to the embodiment;

FIGS. 8A, 8B, 9A, 9B, 10A and 10B are schematic sectional views showing steps of manufacturing a semiconductor device in sequential order according to a comparative example;

DETAILED DESCRIPTION

Figure 1:
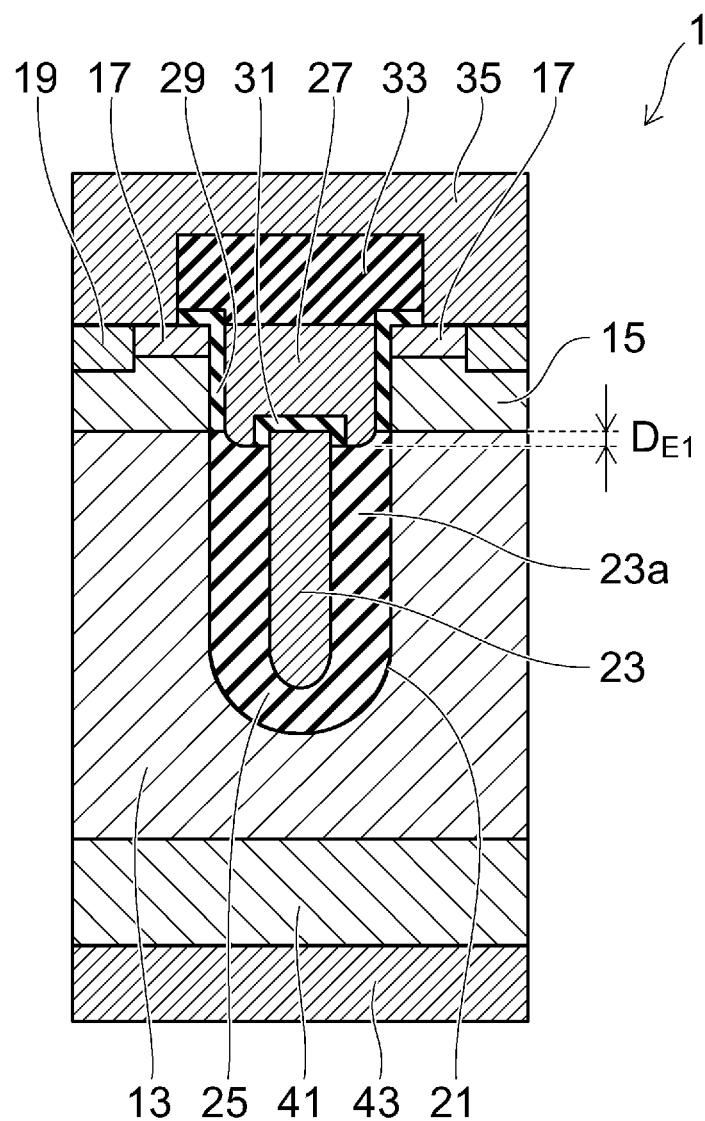
FIG. 1 is a schematic sectional view showing a semiconductor device according to an embodiment.

According to one embodiment, in a method of a semiconductor device, a trench is formed in the direction of a lower surface from an upper surface of a semiconductor layer. A first insulating film is formed to cover an inner surface of the trench. An electrode material is formed to fill the trench and cover the upper surface of the semiconductor layer. The electrode material is selectively removed except a portion of the electrode material to fill the trench and a portion of the electrode material to cover an opening of the trench. The first insulating film to cover an upper portion of the trench is removed. The portion of the electrode material to cover the opening of the trench and the portion of the electrode material to fill the trench are etched back to form a first electrode at a lower portion of the trench. A second insulating film to cover an inner surface of the upper portion of the trench, and a third insulating film to cover an end portion of the first electrode exposed from the first insulating film at the upper portion of the trench are formed. A second electrode is formed above the first electrode through the third insulating film.

Hereinafter, embodiments will be described with reference to the drawings. In the drawings, same reference characters denote the same or similar portions. The same numbers are given to the same portions in the drawings, and the detailed description of the same portions will be arbitrarily omitted, and the different portions will be described.

In addition, the drawings are schematic or conceptual, and the relation between the thickness and width of each portion, and the proportion of the sizes between portions and so on are not necessarily the same as an actual one.

In addition, even if the same portions are shown in the drawings, the respective sizes and proportions of the same portions may sometimes be shown different from drawing to drawing.

FIG. 1 is a schematic sectional view showing a semiconductor device 1 of an embodiment. The semiconductor device 1 is a power MOSFET (Metal Oxide Semiconductor Field Effect Transistor) for power control, for example, and has a trench gate structure. In the embodiment described below, the description will be made such that a first conductivity type is an n-type and a second conductivity type is a p-type. But conductivity types are not limited. A first conductivity type may be a p-type and a second conductivity type may be an n-type.

As shown in FIG. 1, the semiconductor device 1 has an n-type drift layer 13 (a semiconductor layer) 13, a p-type base layer 15, and an n-type source layer 17. The p-type base layer 15 is provided on the n-type drift layer 13, and the n-type source layer 17 is provided on the p-type base layer 15. In addition, a p-type contact layer 19 adjacent to the n-type source layer 17 is provided on the p-type base layer 15.

In addition, the n-type drift layer 13 may be of a structure including a super junction in which n-type pillars and p-type pillars are alternately arranged. In the following description, the conductivity types of the respective layers will be omitted for simplicity.

The trench gate structure according to the embodiment includes a field plate electrode 23 (a first electrode) which is provided inside a trench 21 reaching from the source layer 17 to the drift layer 13. The field plate electrode 23 (hereinafter, referred to as the FP electrode 23) is provided at a bottom portion of the trench 21, and is surrounded by the drift layer 13. And, a field plate insulating film 25 (a first insulating film) is provided between the drift layer 13 and the FP electrode 23.

In addition, a gate electrode 27 (a second electrode) is provided above the FP electrode 23. The gate electrode 27 faces the drift layer 13, the base layer 15 and the source layer 17. And a gate insulating film 29 (a second insulating film) is provided between the gate electrode 27 and each of the drift layer 13, the base layer 15 and the source layer 17.

In addition, the FP electrode 23 is provided such that an upper end 23a protrudes higher than the FP insulating film 25. Furthermore, the upper end 23a of the FP electrode 23 is covered with an insulating film 31 (a third insulating film). And the FP electrode 23 and the gate electrode 27 are insulated by means of the insulating film 31.

An interlayer insulating film 33 is provided on the gate electrode 27. And, a source electrode 35 to cover the interlayer insulating film 33, the source layer 17 and the contact layer 19 is provided. The source electrode 35 contacts the source layer 17 and the contact layer 19.

On the other hand, an n-type drain layer 41 is provided at the rear surface side of the drift layer 13 which is opposite to the base layer 15. The drain layer 41 contains n-type impurities which are doped with in higher concentration than that of the drift layer 13. In addition, a drain electrode 43 is provided on the rear surface of the drain layer 41.

In the semiconductor device 1, it is possible to control a protrusion amount $D_{E1}$ of the upper end 23a of the FP electrode 23, as described below. And, the FP electrode 23 is electrically connected to the source electrode 35 at a portion not shown in the drawing. Accordingly, it is possible to reduce a parasitic capacitance between the gate and the source by suppressing the protrusion amount $D_{E1}$ of the upper end 23a of the FP electrode 23.

A method of manufacturing the semiconductor device 1 will be described with reference to FIGS. 2A, 2B, 3A, 3B, 4A, 4B, 5A, 5B, 6A, 6B, 7A and 7B. FIGS. 2A, 2B, 3A, 3B, 4A, 4B, 5A, 5B, 6A, 6B, 7A and 7B are schematic sectional views showing a manufacturing process of the semiconductor device 1 of the embodiment.

Figure 2B:
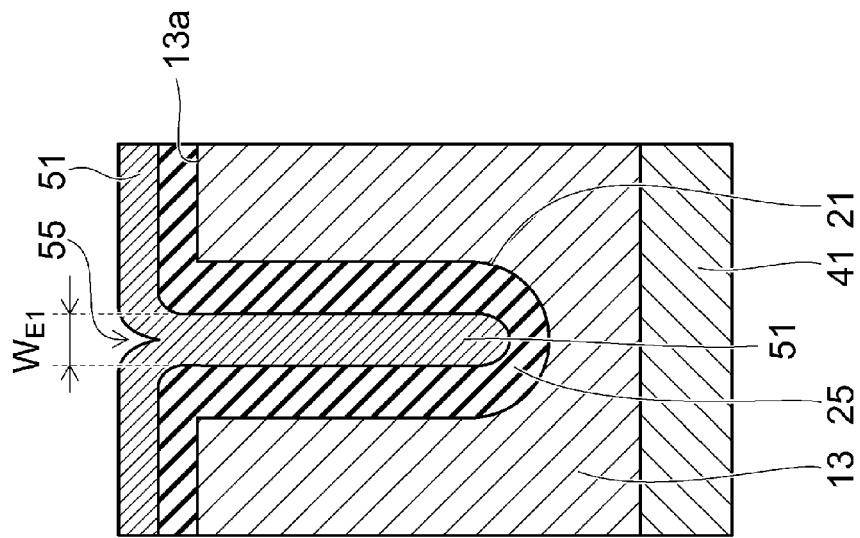
Figure 2A:
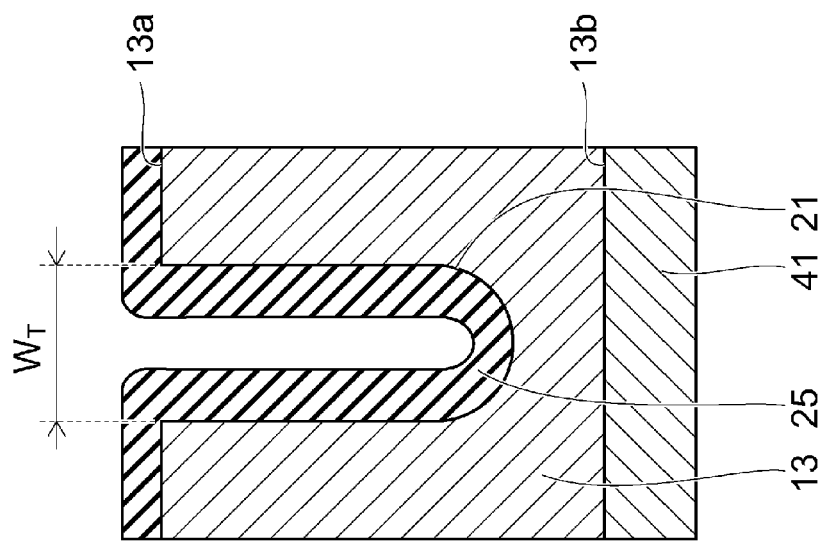

FIG. 2A shows a partial cross section of a semiconductor wafer in which the trench 21 is formed. The semiconductor wafer includes a silicon substrate which function as the drain layer 41, and a silicon layer (the drift layer 13) which is epitaxially grown on the silicon substrate, for example. In addition, the silicon substrate itself may be made the drift layer 13. In this case, the drain layer 41 is formed by making the silicon substrate a thin layer and then by performing ion implantation of n-type impurities on the rear surface side.

The trench 21 is formed in the direction from an upper surface 13a to a lower surface 13b of the drift layer 13 using an RIE (Reactive Ion Etching) method, for example. A width $W_T$ of the trench 21 is approximately 1 to 2 micrometer (μm), for example, and a depth of the trench 21 is approximately 5 to 7 μm, for example.

Subsequently, the field plate insulating film 25 (hereinafter, referred to as the FP insulating film 25) is formed on the upper surface 13a of the drift layer 13 and on an inner surface of the trench 21. The FP insulating film 25 is formed by thermally oxidizing the drift layer 13, for example. In addition, the FP insulating film 25 may be formed using a CVD (Chemical Vapor Deposition) method.

The FP insulating film 25 is provided with a thickness to withstand a voltage applied between the source electrode 35 and the drain electrode 43. Accordingly, the FP insulating film 25 is thicker than the gate insulating film 29 which is provided between the gate electrode 27 and the base layer 15 and controls a threshold voltage of a MOS gate.

A shown in FIG. 2B, an electrode material 51 is formed above the drift layer 13 to fill into the trench 21. The electrode material 51 is polycrystalline silicon (polysilicon) doped with n-type impurities, for example. The electrode material 51 is formed using a CVD method, for example.

As shown in FIG. 3A, a resist mask 61 is formed above the trench 21. The resist mask 61 is formed so that a width of the resist mask 61 is equal to or larger than the width $W_T$ (refer to FIG. 2A) of the trench 21.

The electrode material 51 formed above the upper surface 13a of the drift layer 13 is selectively etched using the resist mask 61. The electrode material 51 is etched using a chemical dry etching (CDE) method, for example. Therefore, the electrode material 51 can be removed except a portion 51a which fills the trench 21 and a portion 51b to cover an opening of the trench 21.

In the case where a CDE method is used, the electrode material 51 is isotropically etched. Therefore, the portion 51b (hereinafter, referred to as the electrode material 51b) to cover the opening of the trench 21 is side-etched in the process of etching the portion formed above the upper surface 13a of the drift layer 13. As a result, the width of the electrode material 51b can be made narrower than a width $W_M$ of the resist mask 61. And a side etching amount $\Delta W_M$ of the electrode material 51b can be controlled based on an etching time.

Figure 4A:
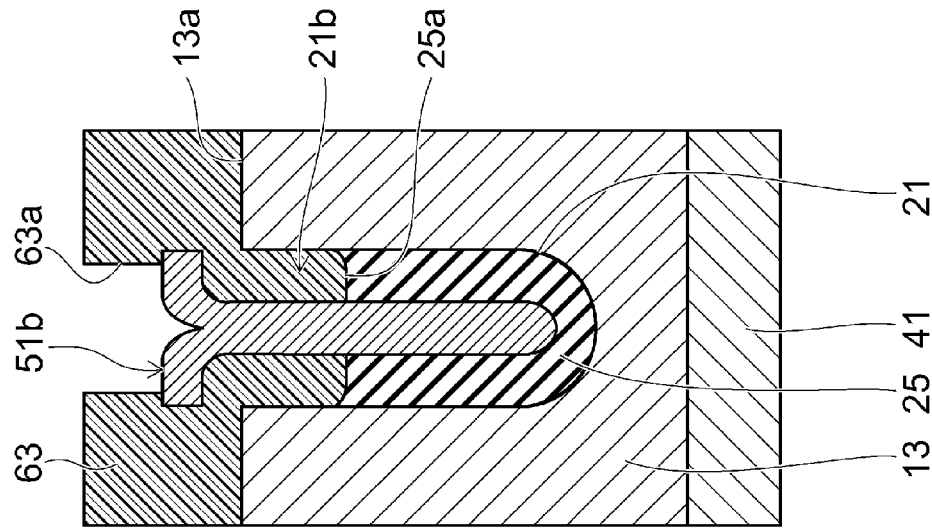

As shown in FIG. 4A, the FP insulating film 25 is etched back using a wet etching method, for example. In the embodiment, since the electrode material 51b remains, the FP insulating film 25 formed above the upper surface 13a of the drift layer 13 is firstly etched. Subsequently, the FP insulating film 25 to cover an upper portion of the trench 21 is etched through a space between the end of the electrode material 51b and the drift layer 13.

In the embodiment, a depth of the FP insulating film 25 which is etched back, that is a so-called amount of recess $D_{R1}$, depends up a space between the electrode material 51b and the drift layer 13, that is, a thickness $d_{FP}$ of the FP insulating film 25. The etching speed of the FP insulating film 25 depends on the thickness $d_{FP}$ of the FP insulating film 25, for example, and the etching gradually makes progress between the electrode material 51b and the drift layer 13. Since the amount of recess $D_{R1}$ of the FP insulating film 25 does not depend on the width $W_T$ of the trench 21, and a width $W_{E1}$ (refer to FIG. 2B) of the electrode material which fills the trench, it is easy to control the amount of recess $D_{R1}$ of the FP insulating film 25.

The position of the end of the electrode material 51b for the trench 21 can be precisely controlled with photolithography and dry etching. Therefore, in accordance with the manufacturing method of the embodiment, the reproducibility of the amount of recess $D_{R1}$ can be improved, and the variation in the amount of recess $D_{R1}$ can be suppressed. It is possible to improve the controllability of the amount of recess $D_{R1}$ of the FP insulating film 25, by making a width $W_{E2}$ of the electrode material 51b equal to or larger than the trench width $W_T$, for example.

Figure 4B:
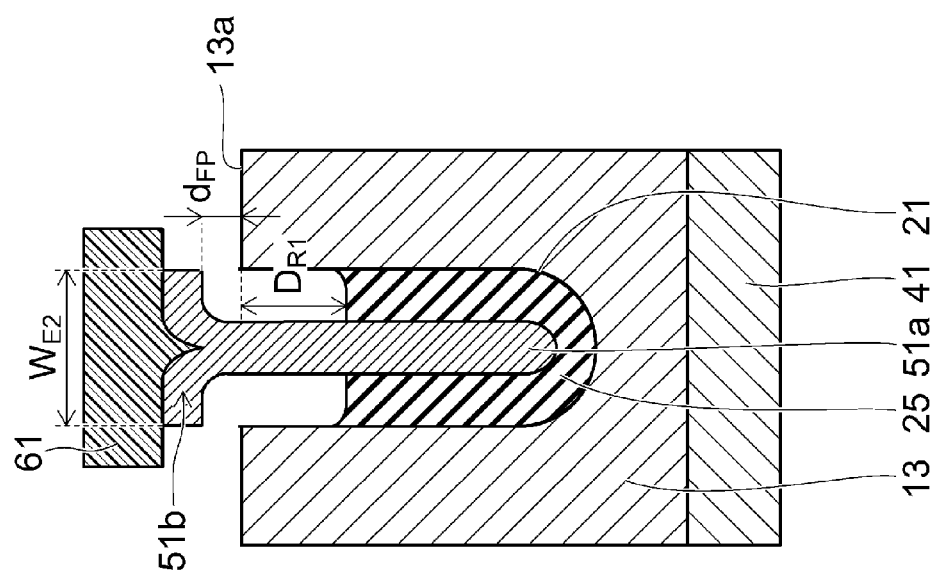

As shown in FIG. 4B, a resist mask 63 to cover the upper surface 13a of the drift layer 13 is formed. The resist mask 63 fills an upper space 21b of the trench 21 in which the FP insulating film 25 is etched back, and further has an opening 63a to expose the electrode material 51b.

Figures 5A, 5B:
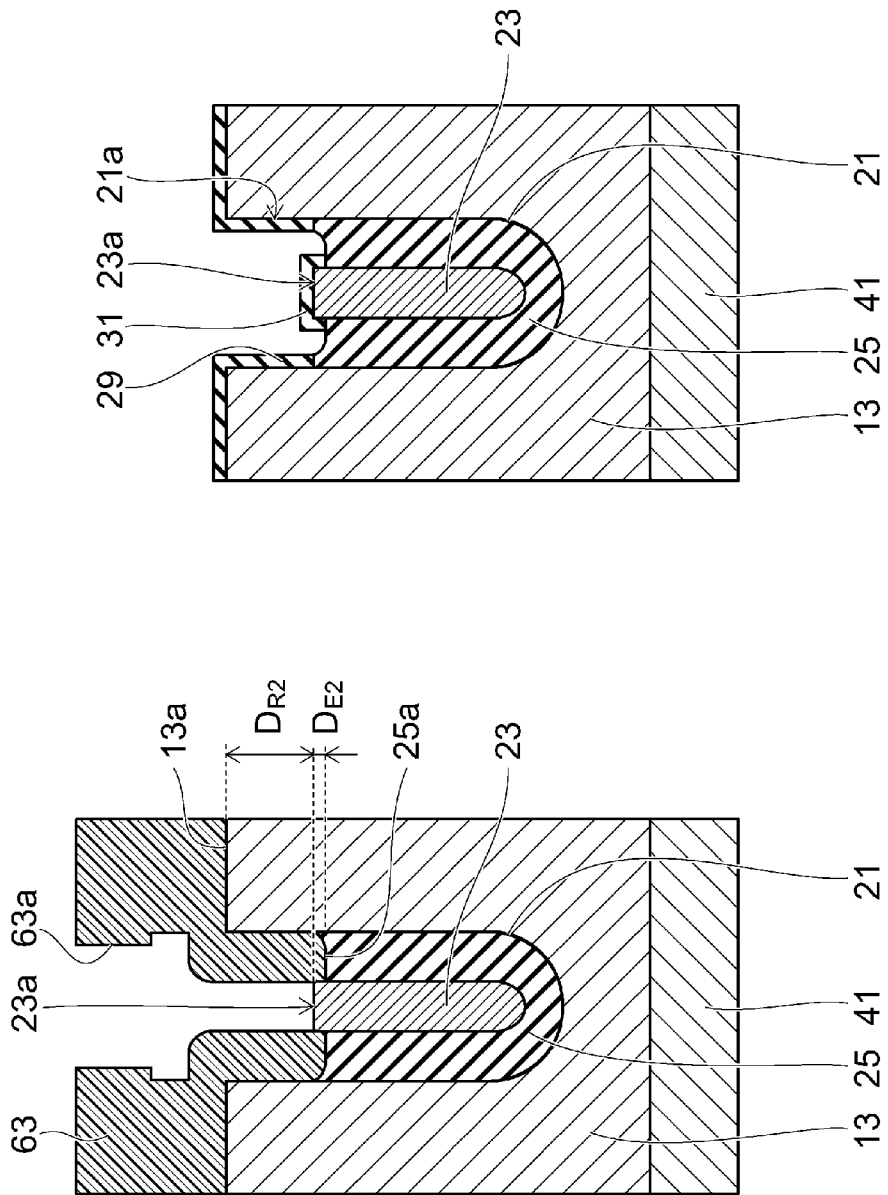

As shown in FIG. 5A, the upper portion of the electrode material 51 which fills the trench 21 is etched back through the opening 63a to form the FP electrode 23 at the lower portion of the trench 21. A CDE method is used for etching the electrode material 51, for example. The etching amount of the electrode material 51 is controlled so that a spacing between the upper surface 13a of the drift layer 13 and an upper end 23a of the FP electrode 23, that is a so-called amount of recess $D_{R2}$, becomes a prescribed value. A protrusion amount $D_{E2}$ of the FP electrode 23 which protrudes from an upper end 25a of the FP insulating film 25 can be controlled. It is possible to reduce a parasitic capacitance between the gate and the source, by making the protrusion amount $D_{E2}$ of the FP electrode 23 small, for example.

As shown in FIG. 5B, the gate insulating film 29 is formed on an inner surface 21a of the upper portion of the trench 21. The gate insulating film 29 is a silicon oxide film, for example, and is formed by thermally oxidizing the drift layer 13. The upper portion of the FP electrode 23 is also thermally oxidized at the same time, and thereby the insulating film 31 is formed.

As shown in FIG. 6A, an electrode material 53 is formed above the drift layer 13. The electrode material 53 fills an upper space 21b of the trench 21. The electrode material 53 is polysilicon doped with n-type impurities, for example, and is formed using a CVD method.

As shown in FIG. 6B, the electrode material 53 is etched back to form the gate electrode 27 above the FP electrode 23. A CDE method is used for etching the electrode material 53, for example.

As shown in FIG. 7A, the base layer 15 is formed in the drift layer 13. The base layer 15 is formed by performing ion implantation of p-type impurities into the upper portion of the drift layer 13, for example. The p-type impurities which are ion implanted into the drift layer 13, such as boron (B), are activated by a thermal treatment, and are further diffused. At this time, the base layer 15 is formed so that the lower end of the base layer 15 does not become deeper than the lower end of the gate electrode 27.

As shown in FIG. 7B, the interlayer insulating film 33 is formed on the gate electrode 27. Furthermore, after the gate insulating film 29 formed on the base layer 15 is removed, the source layer 17 and the contact layer 19 are formed in the base layer 15. The source layer 17 is formed by selectively performing ion implantation of arsenic (As) that is an n-type impurity into the upper portion of the based layer 15, for example. The contact layer 19 is formed by performing ion implantation of boron (B) that is a p-type impurity between the two source layers 17, for example.

The source electrode 35 which covers the interlayer insulating film 33, and contacts the source layer 17 and the contact layer 19 is formed. Furthermore, the drain electrode 43 which contacts the drain layer 41 is formed, and thereby the semiconductor device 1 is completed.

Figure 11A:
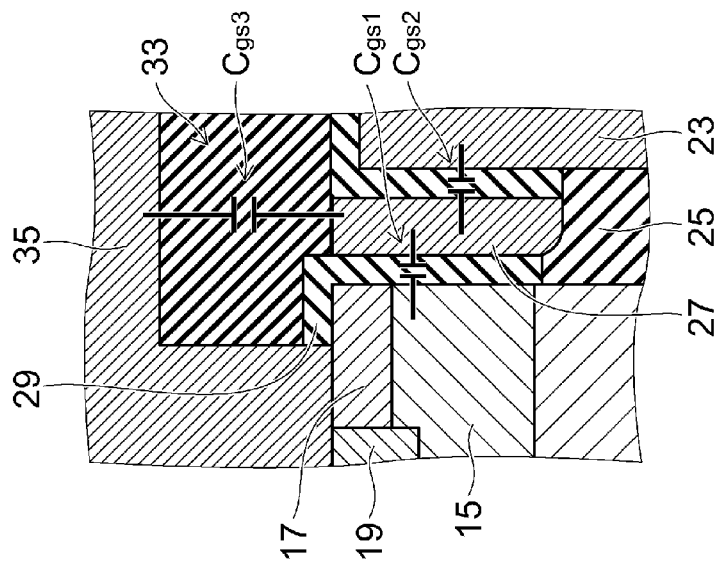
FIGS. 11A and 11B are schematic sectional views showing the semiconductor device according to the comparative example.
Figure 11B:
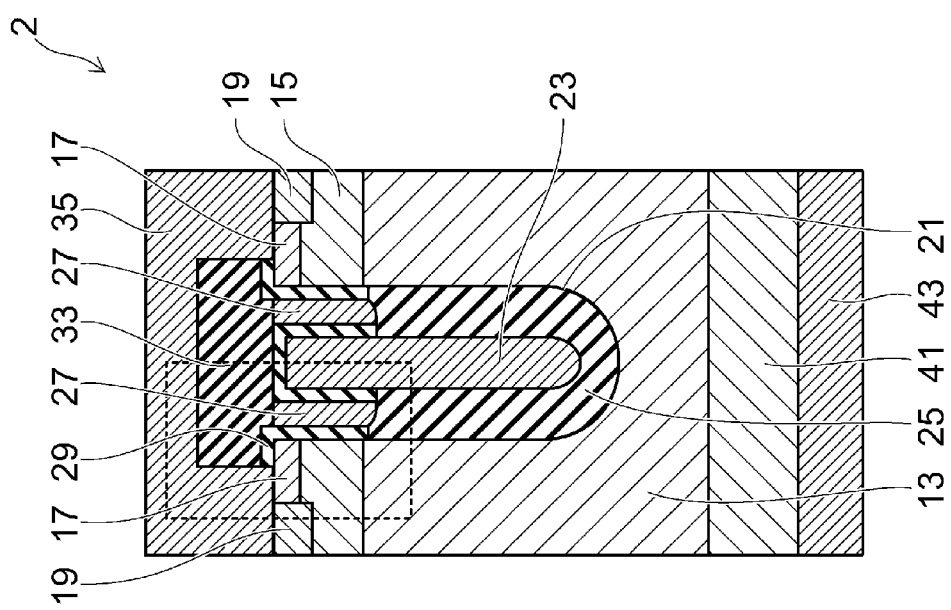

A method of manufacturing a semiconductor device 2 of a comparative example will be described with reference to FIGS. 8A, 8B, 9A, 9B, 10A, 10B, 11A, and 11B. FIGS. 8A, 8B, 9A, 9B, 10A, and 10B are schematic sectional views showing a manufacturing process of the semiconductor device 2 of the comparative example. FIG. 11A and FIG. 11B are schematic sectional views showing the semiconductor device 2 of the comparative example.

As shown in FIG. 8A, also in the manufacturing process of the semiconductor device 2 of the comparative example, the electrode material 51 fills the trench 21. The electrode material 51 is polycrystalline silicon (polysilicon) doped with n-type impurities, for example.

As shown in FIG. 8B, the electrode material 51 is etched back to form the FP electrode 23 inside the trench 21. A CDE method is used for etching the electrode material 51, for example. In this case, an amount of recess $D_{R3}$ of the electrode material 51 is made smaller than the amount of recess $D_{R2}$ shown in FIG. 5A to also leave the FP electrode 23 at the upper portion of the trench 21.

Figure 9A:
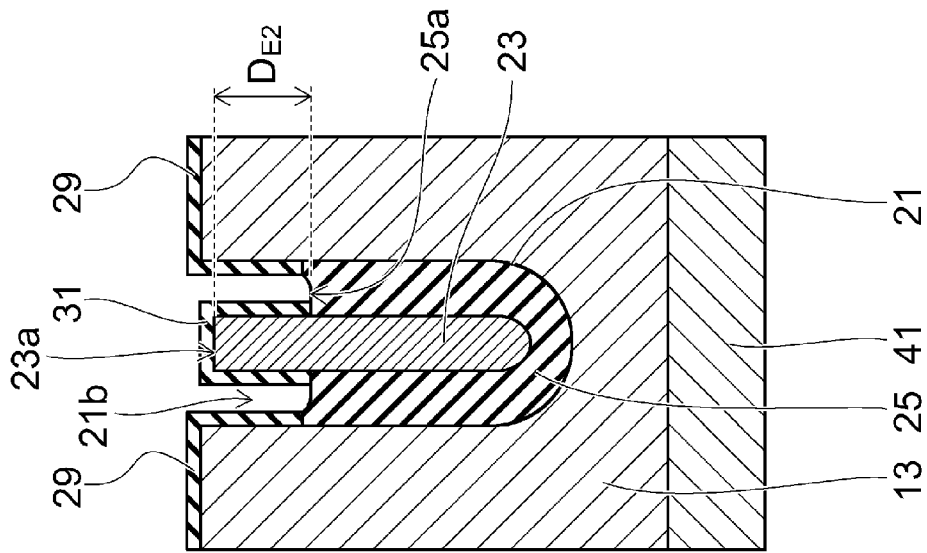

As shown in FIG. 9A, the FP insulating film 25 to cover the upper surface 13a of the drift layer 13 is removed, and the FP insulating film 25 to cover the upper portion of the trench 21 is etched back.

Figure 9B:
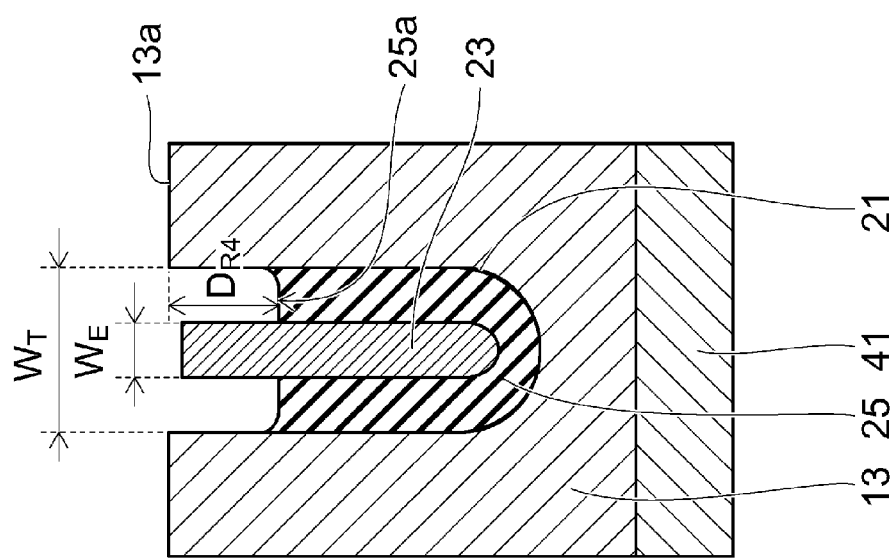

As shown in FIG. 9B, the gate insulating film 29 is formed on the upper portion of the trench 21. The gate insulating film 29 is a silicon oxide film, for example, and is formed by thermally oxidizing the drift layer 13. The upper portion of the FP electrode 23 is also thermally oxidized at the same time, and thereby the insulating film 31 is formed.

As shown in FIG. 10A, the electrode material 53 is deposited above the drift layer 13 and the trench 21 to thereby bury the electrode material 53 inside the upper space 21b of the trench 21 in which the FP insulating film 25 is etched back. The electrode material 53 is polysilicon doped with n-type impurities, for example.

As shown in FIG. 10B, the electrode material 53 is etched back to form the gate electrodes 27 at the upper portion of the trench 21. The gate electrodes 27 are formed at the both sides of the FP electrode 23 so that each faces the drift layer 13 through the gate insulating film 29. In addition, the FP electrode 23 and the gate electrode 27 are electrically insulated by the insulating film 31.

Subsequently, the semiconductor device 2 shown in FIG. 11A is completed through the manufacturing processes shown in FIG. 7A and FIG. 7B. In the semiconductor device 2, the FP electrode 23 extends between the two gate electrodes 27.

A parasitic capacitance $C_{gs}$ between the gate and the source of the semiconductor device 2 includes three components $C_{gs1}$, $C_{gs2}$ and $C_{gs3}$ shown in FIG. 11B. That is, $$C_{gs}=C_{gs1}+C_{gs2}+C_{gs3}$$

$C_{gs1}$ is a parasitic capacitance between the gate electrode 27 and the base layer 15. The base layer 15 is electrically connected to the source electrode 35 through the contact layer 19. $C_{gs2}$ is a parasitic capacitance between the gate electrode 27 and the FP electrode 23. The FP electrode 23 and the source electrode 35 are electrically connected at the portion not shown in the drawings. And, $C_{gs3}$ is a parasitic capacitance between the gate electrode 27 and the source electrode 35.

The thick interlayer insulating film 33 lies between the gate electrode 27 and the source electrode 35. Among these three parasitic capacitances, $C_{gs3}$ becomes smaller than the other two components. Accordingly, it may be thought that $C_{gs1}$ and $C_{gs2}$ are dominant in the parasitic capacitance $C_{gs}$ between the gate and the source.

In the semiconductor device 1 of the embodiment, the protrusion amount $D_{E2}$ of the FP electrode 23 protruding from the upper end 25a of the FP insulating film 25 can be controlled by the amount of recess $D_{R2}$ of the electrode material 51 (refer to FIG. 5A). That is, the protrusion amount $D_{E2}$ of the FP electrode 23 can be made small by making the amount of recess $D_{R2}$ of the electrode material 51 large. The parasitic capacitance $C_{gs}$ between the gate and the source can be reduced.

In the manufacturing process of the comparative example, as shown in FIG. 9A, since the FP electrode 23 is left at the upper portion of the trench 21 to protrude from the upper end 25a of the FP insulating film 25, an amount of recess $D_{R4}$ of the FP insulating film 25 can be stabilized. That is, since the FP insulating film 25 is gradually etched in the state where the FP insulating film 25 is sandwiched between the wall surface of the trench 21 and the FP electrode 23, the amount of recess $D_{R4}$ can easily be controlled. However, a demerit having changes of the amount of recess $D_{R4}$ of the FP insulating film 25 in accordance with changes of the amount of recess $D_{R3}$ (refer to FIG. 8B) of the electrode material 51 may occur.

The amount of recess $D_{R3}$ of the electrode material 51 may sometimes vary depending on the distribution of the etching speed on a wafer, for example. In addition, when the width $W_T$ of the trench 21 changes, a width $W_E$ of the electrode material also changes, and the etching speed of the electrode material 51 changes accordingly. The amount of recess $D_{R3}$ changes depending on the width $W_T$ of the trench 21. As a result, the amount of recess $D_{R4}$ of the FP insulating film 25 varies to cause the length in the depth direction (channel length) of the gate electrode 27 to be changed. Simultaneously, the protrusion amount $D_{E2}$ of the FP electrode 23 changes. $C_{gs1}$ and $C_{gs2}$ do not stabilize to cause the parasitic capacitance $C_{gs}$ between the gate and the source to be varied.

On the other hand, in the manufacturing method of the embodiment, the electrode material 51 is processed to the FP electrode 23 through etchings of two stages. Therefore, the controllability of the amount of recess $D_{R1}$ of the FP insulating film 25 can be improved, and the variation in the parasitic capacitance $C_{gs}$ between the gate and the source can be suppressed.

The amount of recess $D_{R1}$ of the FP insulating film 25 depends on a position of the end of the electrode material 51b. And, it is possible to control the position based on the width of a mask pattern to shape the resist mask 61.

Furthermore, in the embodiment, even when the width $W_T$ of the trench 21 is large, and there is a deep concave portion 55 (refer to FIG. 2B) on the surface of the electrode material 51 to fill the trench 21, it is possible to control the amount of recess $D_{R1}$ without changing the etching condition of the FP insulating film 25. That is, it is possible to suppress the variation in the amount of recess $D_{R1}$ of the FP insulating film 25, by setting the position of the end of the electrode material 51b to an optimum value depending on the opening of the trench 21.

In addition, $C_{iss}$ that is a sum of the parasitic capacitance $C_{gs}$ between the source and the gate and the parasitic capacitance $C_{gd}$ between the gate and the drain has a correlation with the on-resistance. And the change in $C_{gs}$ is reflected to the on-resistance. That is, according to the embodiment, suppressing the variation in the parasitic capacitance $C_{gs}$ between the gate and the source simultaneously leads to suppressing the variation in the on-resistance between the source and the drain.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   forming a trench in the direction of a lower surface from an upper surface of a semiconductor layer;
   forming a first insulating film to cover an inner surface of the trench and the upper surface of the semiconductor layer;
   forming an electrode material to cover the first insulating film;
   selectively removing the electrode material except a portion of the electrode material to fill the trench and a portion of the electrode material to cover an opening of the trench;
   removing a portion of the first insulating film on the upper surface of the semiconductor layer, and a portion of the first insulating film in the trench;
   etching back the portion of the electrode material which covers the opening of the trench and the portion of the electrode material to fill the trench to form a first electrode at an lower portion of the trench;
   forming a second insulating film to cover an inner surface of the upper portion of the trench, and a third insulating film to cover an end portion of the first electrode exposed from the first insulating film at the upper portion of the trench; and
   forming a second electrode above the first electrode through the third insulating film.

2. The method of manufacturing the semiconductor device according to claim 1, wherein the second insulating film is formed by thermally oxidizing the semiconductor layer, and the third insulating film is formed by thermally oxidizing the first electrode.

3. The method of manufacturing the semiconductor device according to claim 1, wherein
   the first insulating film is formed by thermally oxidizing the semiconductor layer.

4. The method of manufacturing the semiconductor device according to claim 2, wherein
   the first insulating film is formed by thermally oxidizing the semiconductor layer.

5. The method of manufacturing the semiconductor device according to claim 1, wherein
   the electrode material is polycrystalline silicon.

6. The method of manufacturing the semiconductor device according to claim 2, wherein
   the electrode material is polycrystalline silicon.

7. The method of manufacturing the semiconductor device according to claim 3, wherein
   the electrode material is polycrystalline silicon.

8. The method of manufacturing the semiconductor device according to claim 1, wherein
   a width of the portion of the electrode material to cover the opening of the trench is equal to or larger than a width of the opening.

9. The method of manufacturing the semiconductor device according to claim 2, wherein
   a width of the portion of the electrode material to cover the opening of the trench is equal to or larger than a width of the opening.

10. The method of manufacturing the semiconductor device according to claim 3, wherein
    a width of the portion of the electrode material to cover the opening of the trench is equal to or larger than a width of the opening.

11. The method of manufacturing the semiconductor device according to claim 4, wherein
    a width of the portion of the electrode material to cover the opening of the trench is equal to or larger than a width of the opening.

12. The method of manufacturing the semiconductor device according to claim 1, wherein
    the first insulating film is thicker than the second insulating film.

* * * * *